US006788079B1

(12) United States Patent
Cheng (10) Patent No.: US 6,788,079 B1
(45) Date of Patent: Sep. 7, 2004

(54) INDEXING MULTIPLE TEST PROBE SYSTEM AND METHOD

(76) Inventor: David Cheng, 711 Hibernia Ct., Sunnyvale, CA (US) 94087

( * ) Notice: Subject to any disclaimer, the term of this patent is extended or adjusted under 35 U.S.C. 154(b) by 0 days.

(21) Appl. No.: 10/066,394

(22) Filed: Feb. 1, 2002

Related U.S. Application Data

(63) Continuation-in-part of application No. 09/348,751, filed on Jul. 6, 1999, now Pat. No. 6,366,103.

(51) Int. Cl.[7] .......................... G10R 1/073; G10R 31/02
(52) U.S. Cl. ....................................... 324/754; 324/758
(58) Field of Search ................................ 324/754, 758, 324/760, 765, 158.1

(56) References Cited

U.S. PATENT DOCUMENTS

| 1,367,285 | A | * | 2/1921 | Stimmel .................... 324/550 |
| 2,478,999 | A | * | 8/1949 | Jesus ......................... 324/550 |
| 3,716,134 | A | * | 2/1973 | Campbell ................... 209/563 |
| 5,099,199 | A | * | 3/1992 | Carter ........................ 324/550 |
| 5,469,064 | A | * | 11/1995 | Kerschner et al. .......... 324/537 |
| 6,366,103 | B1 | * | 4/2002 | Cheng ........................ 324/754 |
| 6,653,853 | B1 | * | 11/2003 | Cheng ........................ 324/754 |

* cited by examiner

*Primary Examiner*—Ernest Karlsen
(74) *Attorney, Agent, or Firm*—Perkins Coie LLP (57) ABSTRACT

A multiple test probe system is disclosed. The multiple test probe system includes a support and a mount pivotally coupled to the support. The mount is capable of pivoting to a number of testing positions. A number of probe assemblies are coupled to the mount and associated with a corresponding number of testing positions. The probe assemblies include a number of electrical contacts coupled to a number of wires in a probe bus regardless of a testing position of the mount. The multiple test probe system further includes an indexing device coupled to the mount to cause the mount to move between the testing positions, whereby the indexing device is a Geneva Mechanism.

16 Claims, 8 Drawing Sheets

INDEXING MULTIPLE TEST PROBE SYSTEM AND METHOD

CROSS REFERENCE TO RELATED APPLICATIONS

This application is a continuation-in-part of co-pending U.S. patent application No. 09/348,751, filed on Jul. 6, 1999, now U.S. Pat No. 6,366,103, which is incorporated herein by reference. This application is also related to co-pending U.S. patent application No. 10/066,391, now U.S. Pat. No. 6,653,853 which is also incorporated herein by reference.

BACKGROUND OF THE INVENTION

The present invention relates to electronic testing systems, and more particularly to test probes for electronic testing systems.

The testing of samples is performed widely in the manufacture of products. For example, the manufacture and fabrication of integrated circuits begin with blank, unpatterned semiconductor wafers. These wafers undergo a number of critical testing steps before being processed and formed into the final integrated circuit form. For example, sheet resistance and wafer (substrate) thickness may be tested in the manufacturing process so that the bulk resistivity of a wafer can be determined.

Testing of sheet resistance, substrate thickness and other characteristics of a semiconductor wafer is often done using a probe assembly having a number of electrical contacts or pins capable of directing a constant current (I) through the film and reading the voltage drop (V) created across the film by the current. Sheet resistance may then be determined by Ohm's law (R=K(V/I)), after which the thickness of the substrate may be calculated using the sheet resistance and the known bulk resistivity ($\rho$) of the film. The constant K is determined by the geometry of the probes in the specific configuration.

Because semiconductor wafers are manufactured from many types of materials, each of which exhibit specific characteristics, a different type of probe assembly may be required for a particular application. For example, probe assemblies with sharper pins (i.e. types "A" or "B" probes) are used for metal film. The sharp pin is utilized because it is able to push into the metal for good contact. On the other hand, probe assemblies with duller pins (i.e. types "C" or "D" probes) are used, for example, for doped silicon applications. Using a dull pin to contact silicon reduces the chance of puncturing the surface of the wafer. Other applications of semiconductor testing require probe assemblies that vary the spacing between the pins and electrical contacts or probe assemblies that apply a different force to the wafer surface (e.g. a spring-loaded pin).

In the prior art, probe assemblies were changed every time a different type of probe was required by a specific application (for example, changing from a type A to a type C probe). Probes were also changed for different applications because of the danger of contamination.

The conventional method of changing probe assemblies is to change it by hand. One problem with associated with this technique is that it increases the risk of error during the operation of the probe assembly. Removal of a probe assembly results in unnecessary wear and tear, which could lead to errors in measurement. Contamination and damage of the delicate probe is also a risk.

Yet another problem inherent in the replacement of a probe test head by hand is that the electrical connection between the probe assembly and the microprocessor controller of the electronic testing system must be broken, therefore increasing the risk for error if the probe assembly is not properly replaced. In addition, the procedure for manually changing probe test heads is impractical. For example, in an automated wafer handling system, each wafer is loaded onto the measurement equipment from a wafer cassette using robotics. Therefore, operators would need to halt the operation of the wafer testing system each time a probe test head needs to be changed.

Because it takes several minutes to manually changing probe test heads, if such a change is needed, it takes much longer to test each individual wafer, decreasing the overall efficiency of the wafer testing system. The changing of probe assemblies is so inconvenient and time consuming that multiple wafer testing systems are often used at considerable additional expense to solve the problem, with each wafer testing system having a different probe assembly.

It is also of importance, in any system where probes are changed, to provide accurate and repeatable mechanical positioning following probe changes. This can be especially important in systems that produce multi-point resistivity maps on semiconductor test wafers, since computed resistivity uniformity may be impacted by probe position reproducibility. Prior art systems, in many cases, have relied solely upon electronic sensors to establish sensor location via switch closures, but this method is susceptible to long term position drift and therefore reliability problems. It also requires lengthy and frequent calibration procedures. It is therefore desirable to have mechanical "hard stop" positioning, with location verification via electronic sensors.

Despite the development of semiconductor technology and the importance of testing wafers accurately and efficiently, a convenient and reliable method and apparatus for changing test probe assemblies remain elusive. In view of the foregoing, what is needed is an efficient method and apparatus for changing probe assemblies for electronic testing systems.

SUMMARY OF THE INVENTION

The present invention fills this need by providing a method and apparatus for changing probe assemblies. Several inventive embodiments of the present invention are described below.

One embodiment of the present invention, a multiple test probe system is disclosed. The system includes a support, a probe bus comprising a plurality of wires and a mount rotationally coupled to the support and capable of rotating to a plurality of testing positions. A plurality of probe assemblies are coupled to the mount and associated with the plurality of testing positions, wherein each of the probe assemblies include a plurality of electrical contacts coupled to the plurality of wires of the probe bus regardless of a testing position of the mount. A Geneva Mechanism having a driven wheel provided with a plurality of slots, is attached to the mount for co-rotation therewith. A drive wheel is rotationally coupled to the support and provided with a drive member engaging one of the plurality of slots of the driven wheel. Rotation of the drive wheel relative to the support provides an incremental angular rotation to the driven wheel due to the engagement of the member with a slot, such that the position after a position when the member is disengaged from the slot coincides with at least one of the plurality of test positions. A motor coupled between the drive wheel and the support is disclosed.

In another embodiment of the present invention, a multiple test probe system is disclosed wherein the driven wheel comprises a plurality of radially extending slots and a concave cam follower guiding surface interposed between each pair of the radially extending slots. The drive wheel comprises a drive member and a restraining cam having a cylindrical convex surface, the drive member of the drive wheel being engaged with one of the radially extending slots to incrementally rotate the driven wheel through rotation of the drive wheel. The cylindrical convex surface of the drive wheel is engaged with the concave cam follower guiding surface of the driven wheel during a portion of time when the drive member is not engaged with the plurality of radially extending slots.

In another embodiment of the present invention, a multiple test probe system comprising a position sensor mounted at a contact position on the support, wherein the position sensor is activated to verify when at least one of the plurality of probe assemblies is in the testing position is disclosed.

In another embodiment of the present invention, a multiple test probe system wherein the position sensor is at least one of a microswitch, an optical sensor, and a magnetic sensor is disclosed.

In another embodiment of the present invention, a multiple test probe system wherein the electrical contacts are coupled to the probe bus in parallel is disclosed.

In another embodiment of the present invention, a multiple test probe system wherein each of the plurality of probe assemblies includes four electrical contacts is disclosed.

In another embodiment of the present invention, a multiple test probe system wherein the position sensor is placed to detect the drive member position during the portion of time the drive member is not engaged with the radially extending slots in the driven wheel is disclosed.

In another embodiment of the present invention, a multiple test probe system wherein at least one of the plurality of radially extending slots is shortened, such that engagement of the shortened slot with the drive member prevents complete rotation of the drive wheel is disclosed.

In another embodiment of the present invention, a method for providing a multiple test probe system is disclosed. The method provides a support, a probe bus comprising a plurality of wires, a mount rotationally coupled to the support and capable of rotating to a plurality of testing positions, and a plurality of probe assemblies coupled to the mount and associated with the plurality of testing positions. Each of the probe assemblies include a plurality of electrical contacts coupled to the plurality of wires of the probe bus regardless of the testing position of the mount. The method provides a Geneva Mechanism having a driven wheel having a plurality of slots, attached to the mount for co-rotation therewith, and a drive wheel rotationally coupled to the support and provided with a member engaging one of the plurality of slots of the driven wheel. Rotation of the drive wheel relative to the support provides an incremental angular rotation to the driven wheel due to the engagement of the member with a slot, such that the position after a position when the member is disengaged from the slot coincides with at least one of the plurality of test positions. The method also provides a motor coupled between the drive wheel and the support is disclosed.

In another embodiment of the present invention, a method for providing a multiple test probe system comprising a driven wheel having a plurality of radially extending slots and a concave cam follower guiding surface interposed between each pair of the radially extending slots is disclosed. The method provides a drive wheel having a drive member and a restraining cam having a cylindrical convex surface, the drive member of the drive wheel being engaged with one of the radially extending slots to incrementally rotate the driven wheel through rotation of the drive wheel and, engaging the cylindrical convex surface of the drive wheel with the concave cam follower guiding surface of the driven wheel during a portion of time when the drive member is not engaged with the plurality of radially extending slots.

In another embodiment of the present invention, a method for providing a multiple test probe system comprising providing a position sensor mounted at a contact position on the support, wherein the position sensor is activated to verify when at least one of the plurality of probe assemblies is in the testing position is disclosed.

In another embodiment of the present invention, a method for providing a multiple test probe system comprising providing the position sensor from at least one of a microswitch, an optical sensor, and a magnetic sensor is disclosed.

In another embodiment of the present invention, a method for providing a multiple test probe system comprising coupling the electrical contacts to the probe bus in parallel is disclosed.

In another embodiment of the present invention, a method for providing a multiple test probe system comprising providing four electrical contacts for each of the plurality of probe assemblies is disclosed.

In another embodiment of the present invention, a method for providing a multiple test probe system comprising placing the position sensor to detect the drive member position during the portion of time the drive member is not engaged with the radially extending slots in the driven wheel is disclosed.

In another embodiment of the present invention, a method for providing a multiple test probe system comprising shortening at least one of the plurality of radially extending slots, such that engagement of the shortened slot with the drive member prevents complete rotation of the drive wheel is disclosed.

One advantage of the present invention is that it allows a multiple probe system to efficiently change probe assemblies for different applications. The present invention eliminates the need to change probe assemblies by hand and further eliminates the need to dedicate more than one multiple probe system to different applications that require different types of probe assemblies. Another advantage of the present invention is that it reduces the chance of both wear and error because the electrical contacts of the probe assemblies are coupled to the probe bus regardless of the position of the mount.

The invention has been described herein in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

DETAILED DESCRIPTION OF THE PREFERRED EMBODIMENT

A method and apparatus for efficiently changing probe test heads that contact a substrate is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
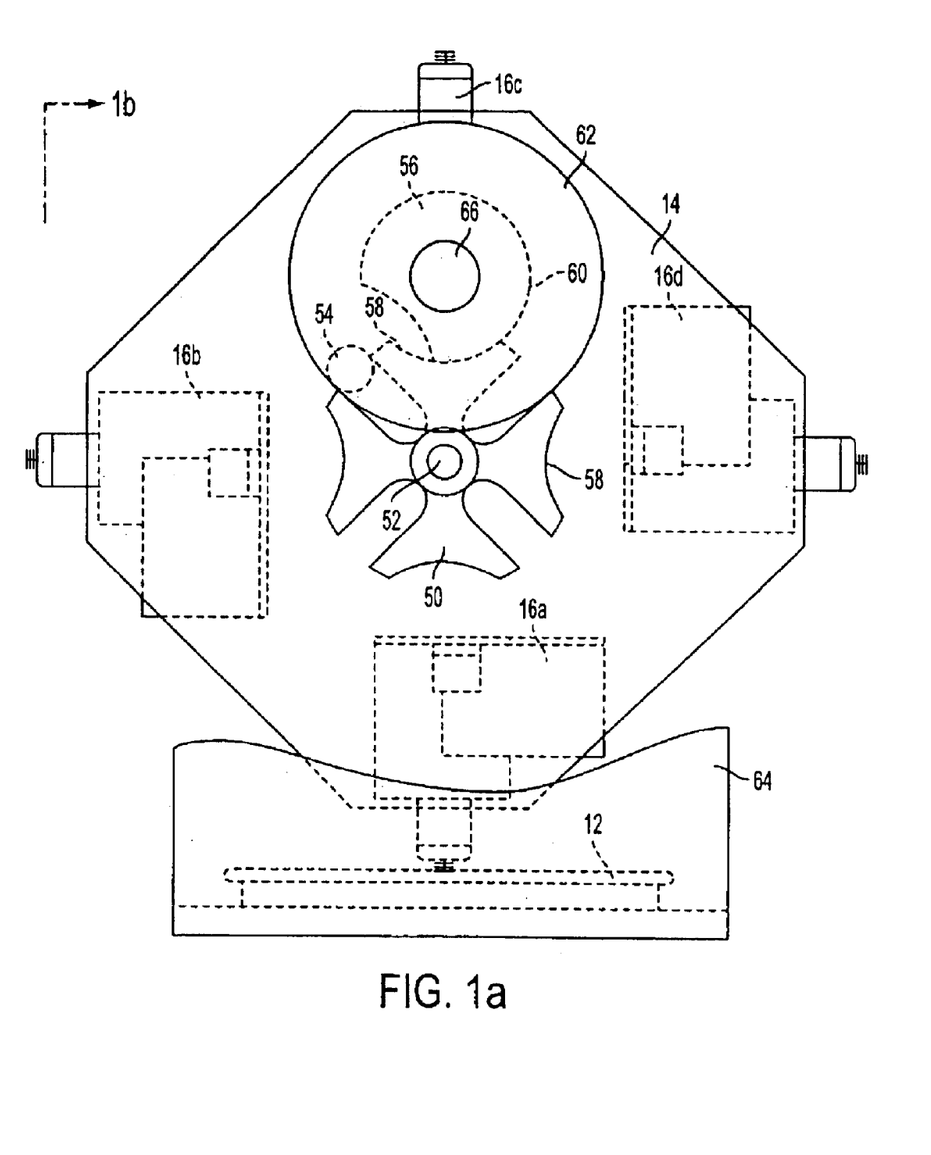
FIG. 1a is a partial rear elevational view of a multiple test probe system employing a Geneva Mechanism in accordance with one embodiment of the present invention.

FIG. 1a is a partial rear elevational view of a multiple test probe system employing a Geneva Mechanism in accordance with one embodiment of the present invention. Portions of the support structure have been removed for clarity. In this embodiment, as an example, four probes 16a–d are mounted on a mounting plate 14, which rotates on support shaft 52 to place test probes 16 into four possible test positions over substrate 12. Rotation and position indexing is provided by a Geneva Mechanism, comprising mainly of a drive wheel 62, drive member 54, and driven wheel 50. Driven wheel 50 is rigidly fixed to mounting plate 14 and is provided with four equally spaced, radially extending slots. The width of each radially extending slot is slightly larger than the diameter of drive member 54. Drive wheel 62 is rotated by drive shaft 66 attached to a motor (not shown) fixed to support 64. Intermittent rotation is obtained by rotating drive wheel 62, causing drive member 54 to enter one of four slots in driven wheel 50. Under continued rotation of drive wheel 62, drive member 54 causes driven wheel 50 to rotate until drive member exits the slot in the driven wheel 50. This motion has caused the driven wheel 50 and probe mounting plate 14 to rotate ¼ turn, indexing probes 16 to the next test position. At that point, drive wheel 62 continues to rotate, but mounting plate 14 remains fixed in position. This is facilitated by the cylindrical convex surface 60 of restraining cam 56 closely engaging matched cam follower surface 58 of driven wheel 50. Mounting plate 14 and attached test probe 16 will remain in the test position during any further rotation of drive wheel 62 until drive member 54 engages the next slot.

Figure 1B:
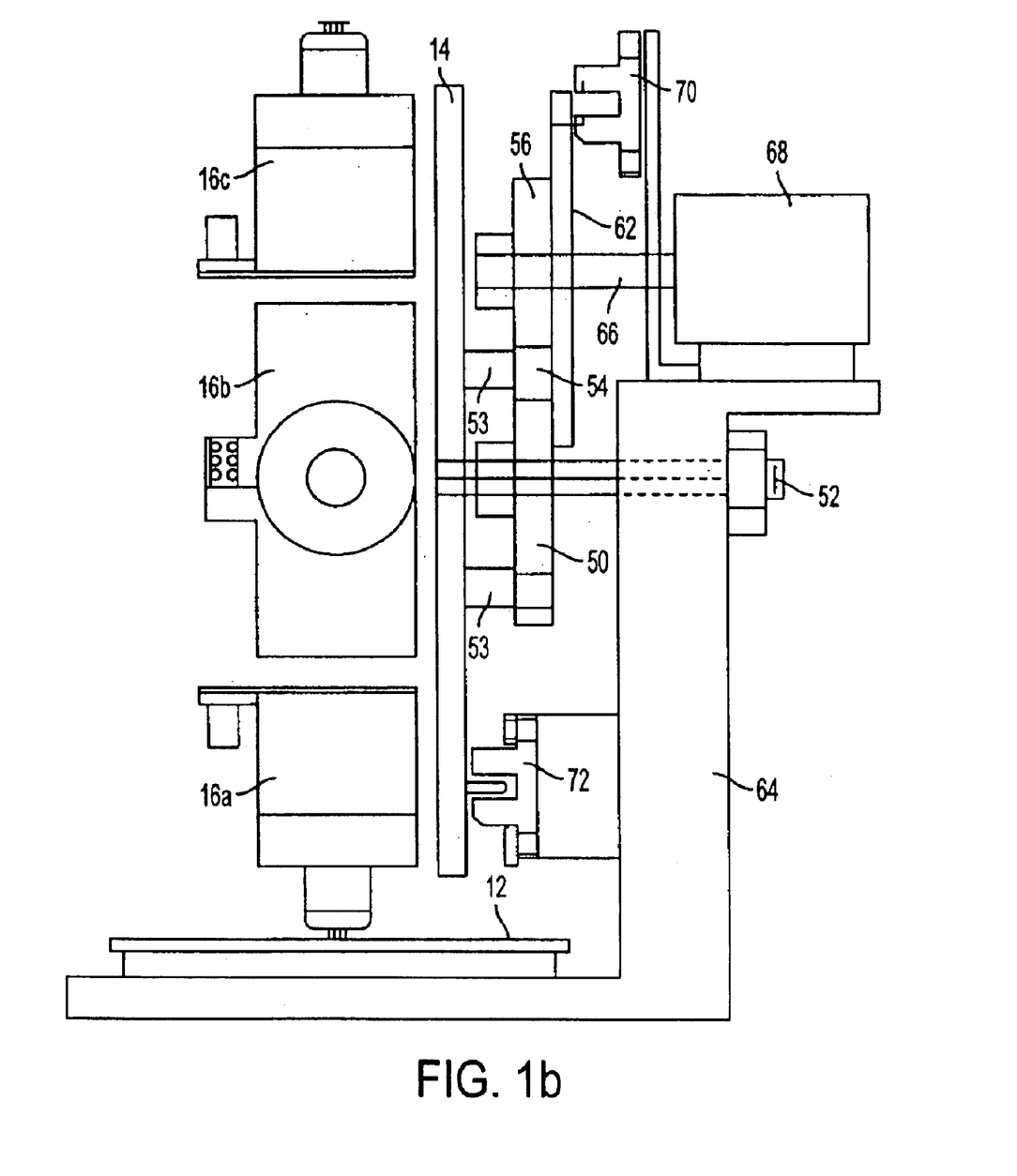
FIG. 1b is a side elevational view of a multiple test probe system employing a Geneva Mechanism in accordance with one embodiment of the present invention.
Figure 2:
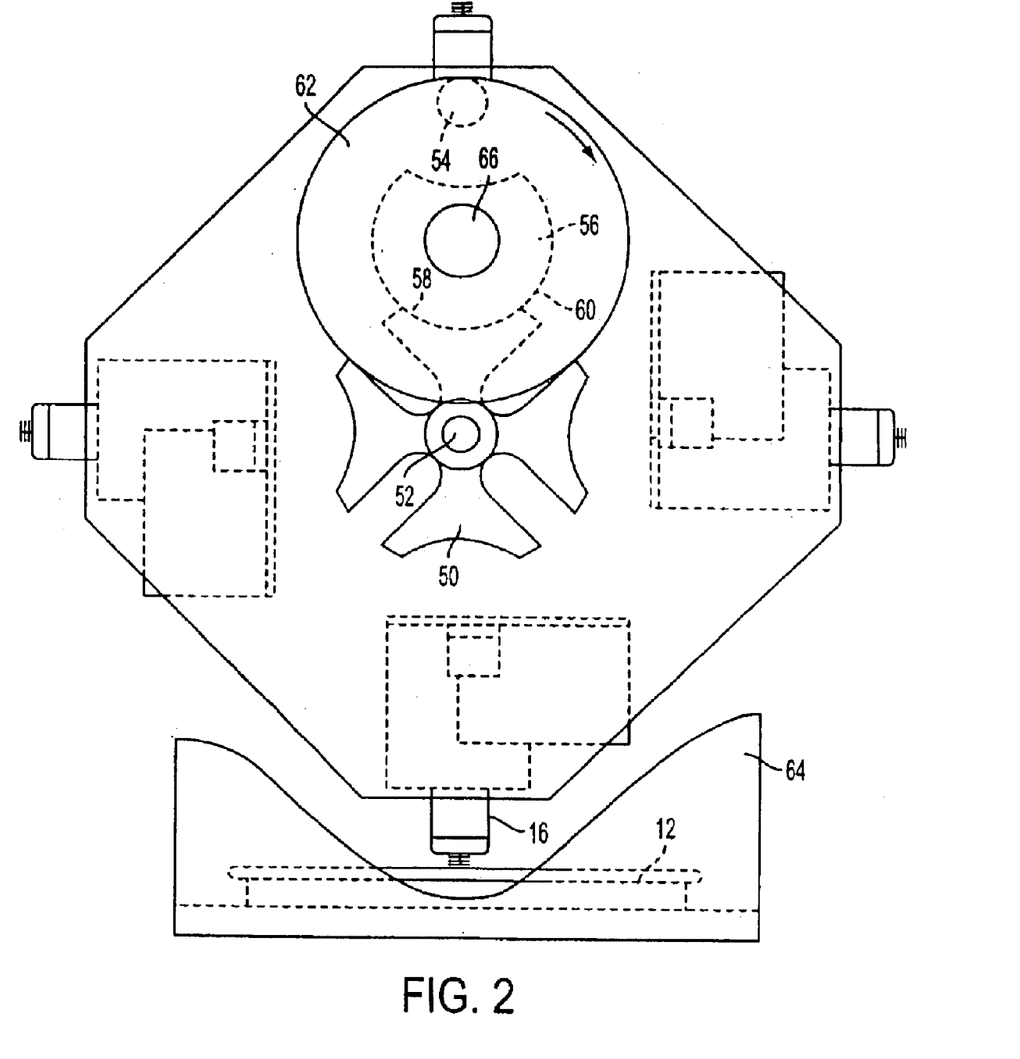
FIG. 2 is the view of FIG. 1a for a second position of the drive wheel in the Geneva Mechanism accordance with one embodiment of the present invention.

FIG. 1b shows an elevational side view of the embodiment in FIG. 1a. Support shaft 52 is fixed to support 64. Mounting plate 14 containing test probes 16 rotates freely on support shaft 52. Driven wheel 50 is fixed to mounting plate 14 via supports 53. Drive motor 68 is fixed to support 64, and rotates drive wheel 62 via drive wheel shaft 66. Position sensor 72, mounted to support 64, is activated when probes are in test position. Sensor 72 is shown as a photo-optical sensor that is activated when an opaque flag inserted between the light source and detector. But other sensors, such as magnetic and micro-switches, may also be used as known to those skilled in the art. By using multiple flags and more than one position sensor 72, the specific identity of each probe can be determined at the test position. This may be done by providing a separate flag keyed to each sensor position, or preferably by using a binary code with a unique sequence of flags at each measurement position (see discussion following). Position sensor 70 may be employed to detect the angular position of the drive member 54, to confirm that a test position has been obtained and locked. The location of sensor 70 may be placed to indicate any drive member angular position not engaging a slot in wheel 50, but preferably this position would be where drive member 54 lies furthest from slot entrances on driven wheel 50, as shown in FIG. 2. Once a particular test position has been reached and verified by sensors 70 and 72, the drive wheel 62 may be stopped by the system controller driving motor 68 to lock the test probe in place. Or, drive wheel 62 may continue to rotate to place another probe into position.

It is not desirable to rotate the mount 14 more than one full rotation, due the possible tangling of wiring attached to the probes 16. Over rotation may be prevented by the system controller monitoring the position sensors 72, or by shortening one of the radially extended slots (not illustrated) in driven wheel 50, such that drive member 54 bottoms in the shortened slot before rotation can be completed. In the latter case, it may be desirable for the system controller to monitor the stall current of motor 68, and reverse rotation of the motor.

Figure 3A:
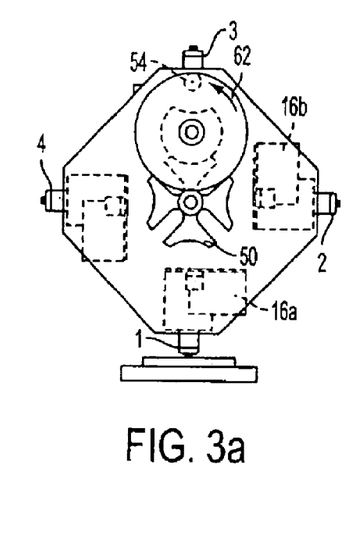
FIGS. 3a–d illustrate the operation of the Geneva Mechanism of FIG. 1a for changing probe measurement positions in accordance with one embodiment of the present invention.
Figure 3B:
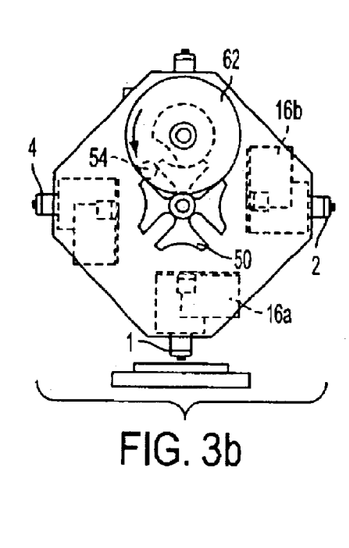
Figure 3C:
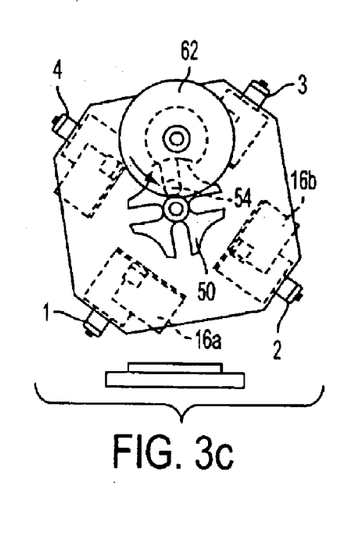
Figure 3D:
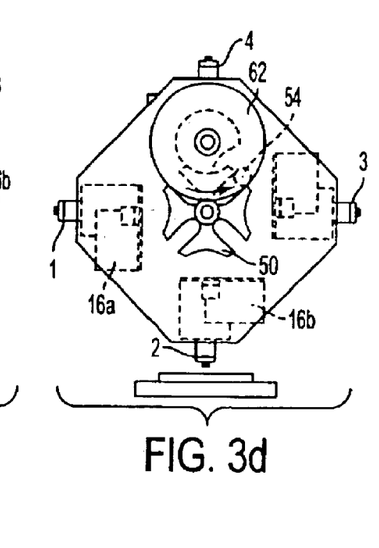

FIGS. 3a–d show the sequential operation of the Geneva Mechanism moving from test position 1 to test position 2. In FIG. 3a, drive member 54 is in the 12 o'clock position, and test probe 16a is locked into test position 1. In FIG. 3b, counterclockwise rotation of drive wheel 62 causes drive member 54 to enter slot on driven wheel 50. In FIG. 3c, continued rotation of drive wheel 62 causes clockwise rotation of mount 14 probes 16. In FIG. 3d, drive member 54 leaves the slot in driven wheel 50, locking probe 16b into test position 2.

An advantage of this embodiment is that once the probe has moved into position, the cam follower relationship of the drive wheel 62 and driven wheel 50 ensure rigid position placement of the measurement probe 16. The measurement probe 16 is locked into place over a wide range of angular movement of drive member 54, so detecting a location to halt the motion of the drive wheel 62 is not critical. This feature allows the use of less precise sensors to be employed, and more importantly, reduces the calibration and adjustment required to maintain the positional accuracy of the probes. Maintaining positional accuracy and mechanical probe rigidity is essential in semiconductor wafer measurement applications, especially in those systems where the probe system makes repeated measurements in the same location on multiple wafer samples. A further advantage is that scale up from more than four probes is straightforward. Any number of probes can be accommodated, in odd or even numbers. This is accomplished by fabricating the Geneva Mechanism with a driven wheel 50 with the same number of uniformly distributed, radially extending slots as desired probe positions. The probes are distributed uniformly on a rotationally symmetric mount 14, where the angle between adjacent probe positions is equal to the angle between adjacent slots on the driven wheel 50. The fabrication of the remaining components of the Geneva Mechanism is well known to those skilled in the art.

Figure 4A:
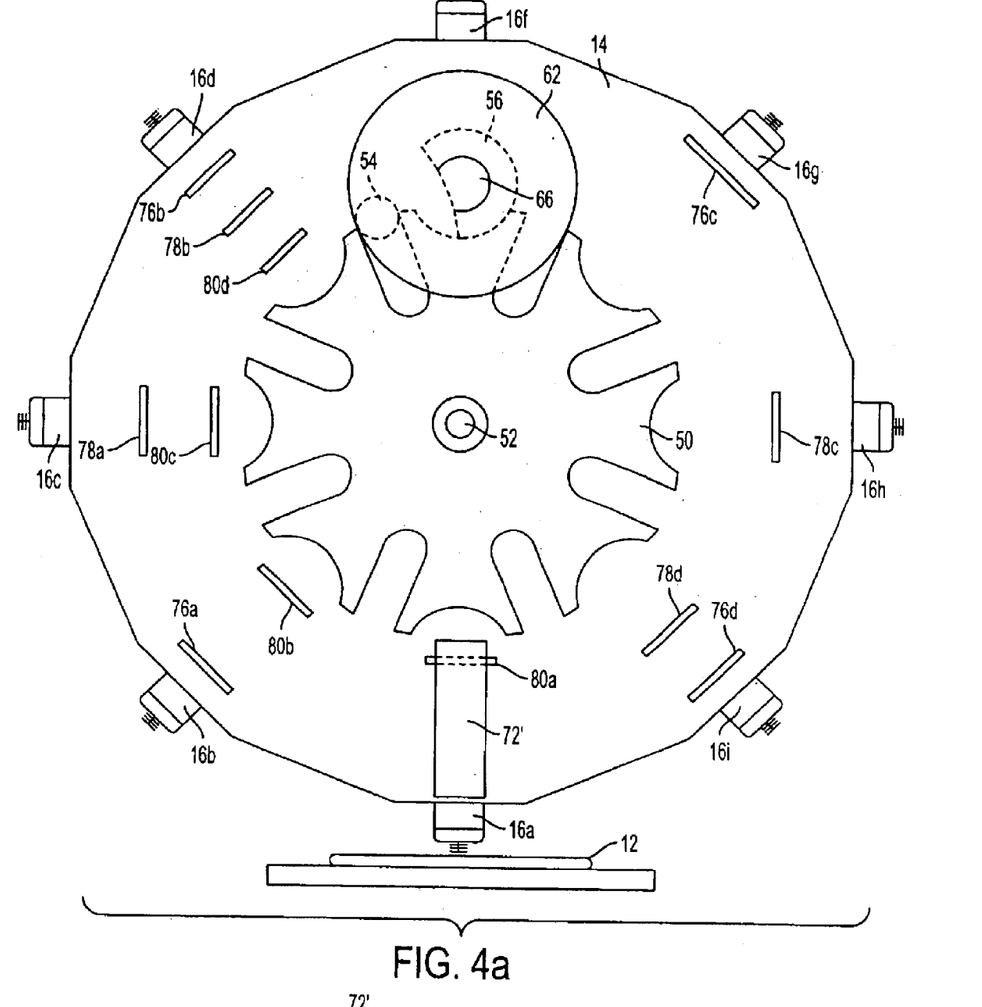
FIG. 4a is a partial rear elevational view of a multiple test probe system employing a Geneva Mechanism and eight probes in accordance with one embodiment of the present invention.

In FIG. 4*a*, a partial rear elevational view of a multiple test probe system employing a Geneva Mechanism and eight probes in accordance with the present invention is shown. Support structure details have been removed for clarity. Driven wheel 50 has eight equally spaced radially extending slots. Probe mount 14 has eight uniformly distributed probes. Drive wheel 62 and drive member 54 act in a manner similar to that described in FIGS. 1–3 previously. Position sensor 72' comprises a three station optical sensor, for the detection of three possible flag locations. Each flag represents a "true" (or 1 state for a single digit in a three digit binary number, providing $2^3$ (eight possible test positions. Flags 76*a*–*d* represent the binary least significant digit, and flags 80*a*–*d* represent the binary most significant digit. For example, in FIG. 4*a*, position of probe 16*f* is binary 000, probe 16*d* is 111, probe 16*a* is 100, and probe 16*h* is 010. The flags may be one position wide, as illustrated, or may extend between test positions so that the system controller knows the position of the probe mount between test positions.

Figure 4B:
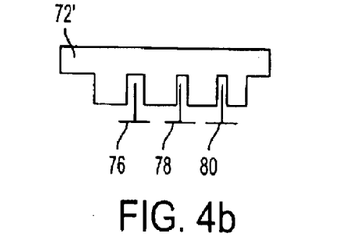
FIG. 4b is the sensor configuration detail of FIG. 4a in accordance with one embodiment of the present invention.

FIG. 4*b* is a detail side view of optical sensor 72', showing how flags 76, 78, 80 would activate the sensor. Each of the ports into which the flags intrude has its own pair of independent optical receiver/transmitters.

Figure 5A:
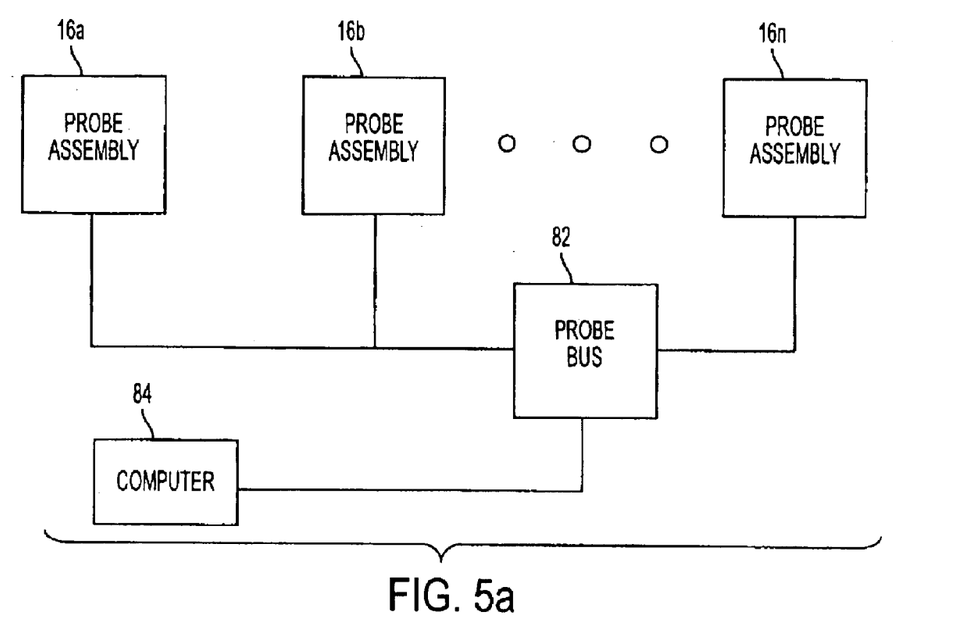
FIG. 5a is a block diagram of the wiring of the probe assemblies to a the probe bus in accordance with one embodiment of the present invention.

FIG. 5*a* is a block diagram of the wiring of probe assemblies 16*a*–*n* to a probe bus 82 in accordance with one embodiment of the present invention. It is in this manner that each probe assembly 16 is coupled to probe bus 82 regardless of a testing position of the other probe assemblies 16. Probe assemblies 16*a*–*n* are preferably coupled to probe bus 82 in parallel. By "in parallel" it is meant that probe assemblies 16*a*–*n* are continuously coupled to a common bus, and not that there is a pin for pin parallelism between probe assemblies 16*a*–*n*. Probe bus 82 is then coupled to computer 84.

Figure 5B:
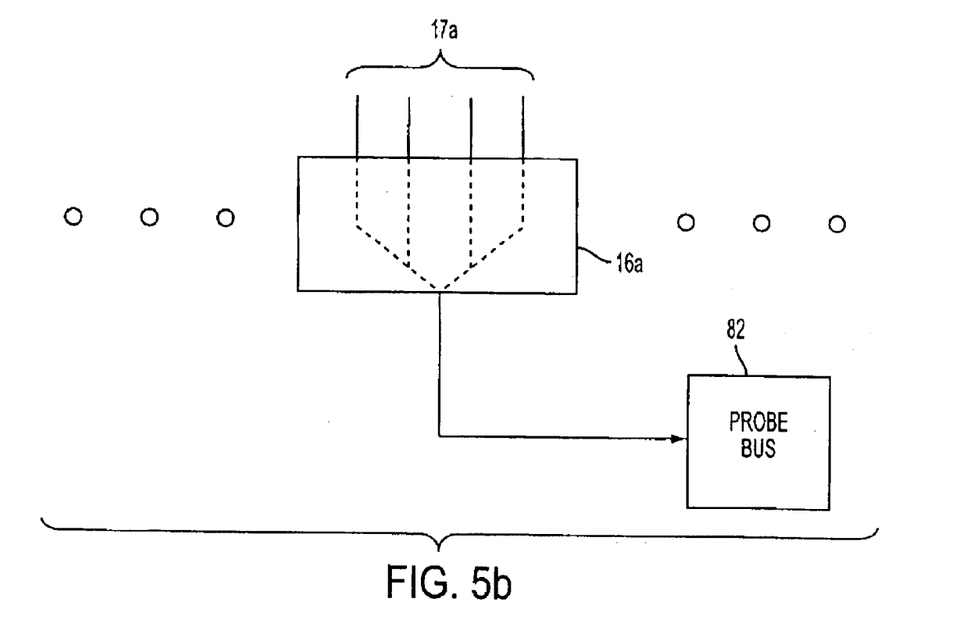
FIG. 5b is a detailed illustration of a probe assembly in accordance with one embodiment of the present invention.

FIG. 5*b* is a detailed illustration of a probe assembly 16 in accordance with one embodiment of the present invention. For exemplary purposes, probe assembly 16 is coupled to four electrical contacts 17 in parallel. Only the specific set of electrical contacts 17 that is in contact with semiconductor wafer 12 will make the electrical connection. For example, if probe assembly 16*a* is in testing position, then electrical contacts 17*a* will make the electrical connection while all other sets of electrical contacts 17*b*–*n* remain idle. Therefore, there is no need to switch circuits for the wiring, although it may be desirable to switch circuits in other applications.

Figure 6:
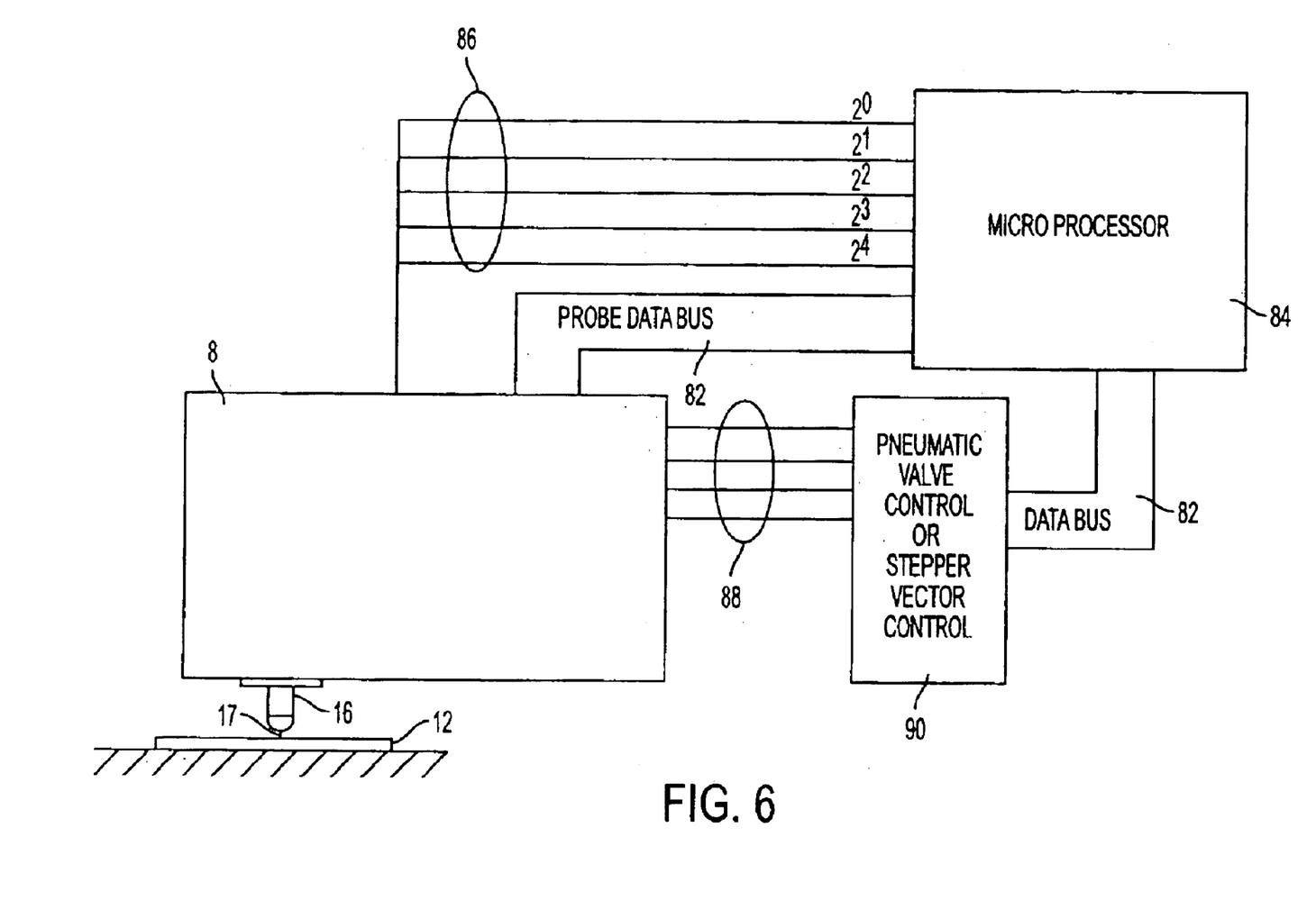
FIG. 6 is a microprocessor or a computer connected to multiple probe system in accordance with one embodiment of the present invention.

FIG. 6 is a microprocessor or computer 84 connected to multiple probe system 8 in accordance with one embodiment of the present invention. Computer 84 may be used to control the operation of multiple probe system 8 by determining the position of probe assemblies 16 through signals received from position sensors via position sensor bus 86. As mentioned previously, these may be signals from separate sensors for each probe position, but preferably are a binary code representing probe position as illustrated in FIG. 4*a*. Computer 84 may then move probe assemblies 16 into testing position by sending the appropriate command signals via data bus 92 to controller 90. Depending on the type of actuator used, controller 90 may be a standard motor controller, stepper motor controller, or pneumatic valve controller. Signals from controller 90 are coupled to actuators in the multiple probe system 8 via signal bus 88. For the case of stepper motors or standard motors, signal bus 88 would be comprised of electrical wires. For the case of pneumatic actuators, signal bus 88 would be comprised of fluid lines connected to the actuators.

Figure 7:
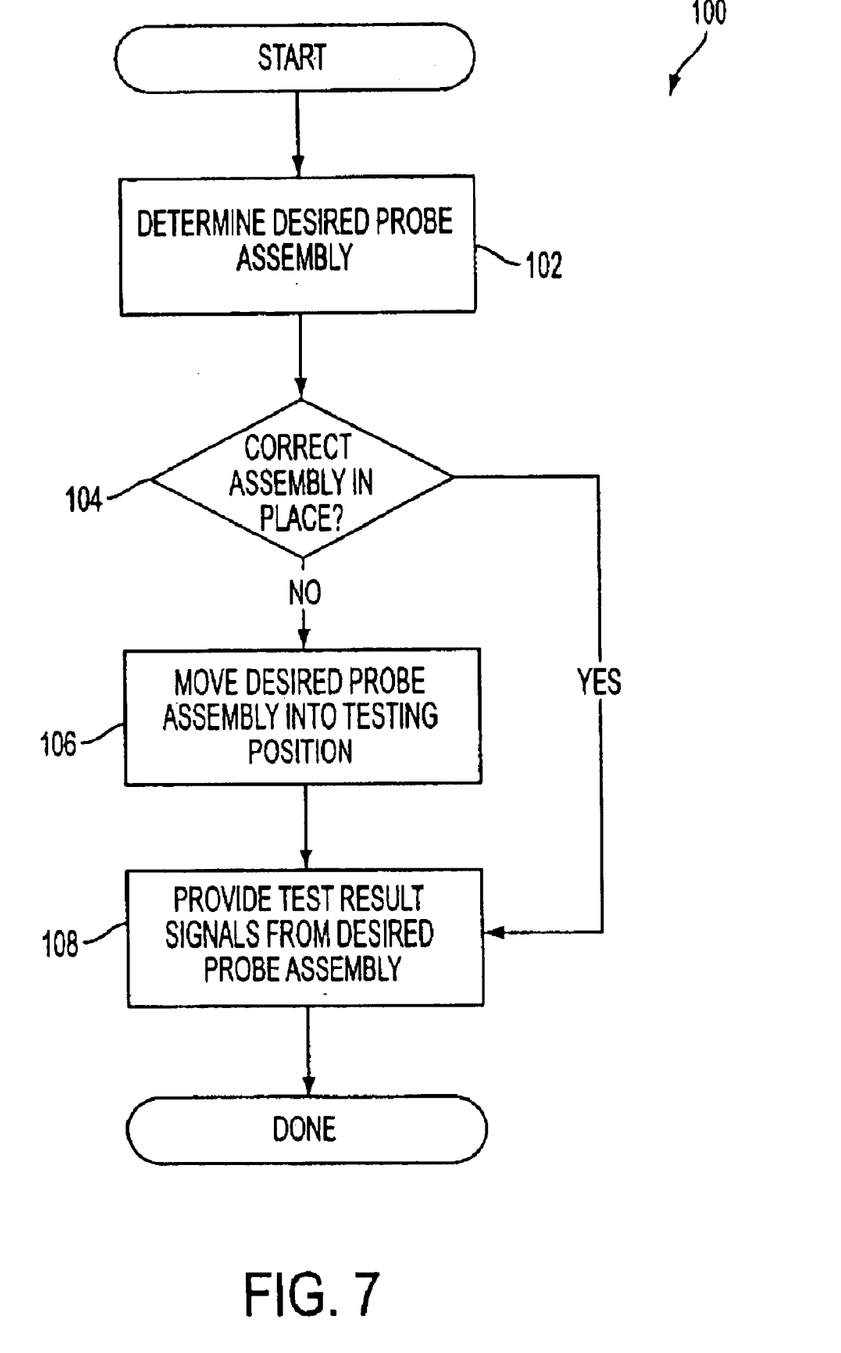
FIG. 7 is a flow chart illustrated a method of determining and changing to a desired probe assembly in accordance with one embodiment of the present invention.

FIG. 7 is a flow chart illustrating a method 100 of determining and changing to a desired probe assembly in accordance with one embodiment of the present invention. Method 100 begins with an act 102 that determines a desired probe assembly. The desired probe assembly is typically determined by the wafer type and the wafer characteristic to be measured. For example, probe assemblies with sharper electrical contacts or pins (such as type A are used for metal film measurements, while probe assemblies with duller pins (such as type C are used for doped silicon applications.

In an act 104, a decision is made as to whether the correct probe assembly is in place. If the desired probe assembly as determined by act 102 is already in testing position as detected by the appropriate position sensor, then method 100 proceeds to an act 108 (discussed below). If the correct probe assembly is not already in place, then method 100 proceeds to an act 106 that moves the desired probe assembly into testing position. An actuator rotates a mount supporting the probe assemblies until the correct probe assembly is in testing position as detected by the appropriate position sensor. Method 100 then proceeds to an act 108 in which test result signals containing for example information about the resistivity and thickness of the wafer, are provided from the desired probe assembly to a computer.

It will therefore be appreciated that the multiple test probe system of the present invention provides for these and other advantages that will become apparent to those skilled in the art upon reading the following detailed description of the invention and studying the accompanying drawings.

In summary, the present invention provides a multiple test probe system for changing probe assemblies for different applications. The invention has been described herein in terms of several preferred embodiments. Other embodiments of the invention will be apparent to those skilled in the art from consideration of the specification and practice of the invention. Furthermore, certain terminology has been used for the purposes of descriptive clarity, and not to limit the present invention. The embodiments and preferred features described above should be considered exemplary, with the invention being defined by the appended claims.

What is claimed is:

1. A multiple test probe system comprising:

a support;

a probe bus comprising a plurality of wires;

a mount rotationally coupled to said support and capable of rotating to a plurality of testing positions;

a plurality of probe assemblies coupled to said mount and associated with said plurality of testing positions, wherein each of said probe assemblies include a plurality of electrical contacts coupled to said plurality of wires of said probe bus regardless of a testing position of said mount;

a Geneva Mechanism having a driven wheel provided with a plurality of slots, attached to said mount for co-rotation therewith, and a drive wheel rotationally coupled to said support and provided with a drive member engaging one of said plurality of slots of said driven wheel, wherein rotation of said drive wheel relative to said support can provide an incremental angular rotation to said driven wheel due to the engagement of said member with a slot, such that a position after a position when said member is disengaged from said slot coincides with at least one of said plurality of test positions; and, a motor coupled between said drive wheel and said support.

2. A multiple test probe system as recited in claim 1, wherein;

said driven wheel comprises a plurality of radially extending slots and a concave cam follower guiding surface interposed between each pair of said radially extending slots;

said drive wheel comprises a drive member and a restraining cam having a cylindrical convex surface, said drive member of said drive wheel being engagable with one of said radially extending slots to incrementally rotate said driven wheel through rotation of said d rive wheel; and, said cylindrical convex surface of said drive wheel is engaged with said concave cam follower guiding surface of said driven wheel during a portion of time when said drive member is not engaged with said plurality of radially extending slots.

3. A multiple test probe system as recited in claim 1, further comprising a position sensor mounted at a contact position on said support, wherein said position sensor is activated to verify when at least one of said plurality of probe assemblies is in said testing position.

4. A multiple test probe system as recited in claim 3, wherein said position sensor is at least one of a microswitch, an optical sensor, and a magnetic sensor.

5. A multiple test probe system as recited in claim 1, wherein said electrical contacts are coupled to said probe bus in parallel.

6. A multiple test probe system as recited in claim 1, wherein each of said plurality of probe assemblies includes four electrical contacts.

7. A multiple test probe system as recited in claim 2, wherein said position sensor is placed to detect said drive member position during said portion of time said drive member is not engaged with said radially extending slots in said driven wheel.

8. A multiple test probe system as recited in claim 2, wherein at least one of said plurality of radially extending slots is shortened, such that engagement of said shortened slot with said drive member prevents complete rotation of said drive wheel.

9. A method for providing a multiple test probe system comprising:

providing a support;

providing a probe bus comprising a plurality of wires;

providing a mount rotationally coupled to said support and capable of rotating to a plurality of testing positions;

providing a plurality of probe assemblies coupled to said mount and associated with said plurality of testing positions, wherein each of said probe assemblies include a plurality of electrical contacts coupled to said plurality of wires of said probe bus regardless of a testing position of said mount;

providing a Geneva Mechanism having a driven wheel provided with a plurality of slots, attached to said mount for co-rotation therewith, and a drive wheel rotationally coupled to said support and provided with a member engaging one of said plurality of slots of said driven wheel, wherein rotation of said drive wheel relative to said support can provide an incremental angular rotation to said driven wheel due to the engagement of said member with a slot, such that a position after a position when said member is disengaged from said slot coincides with at least one of said plurality of test positions; and, providing a motor coupled between said drive wheel and said support.

10. A method for providing a multiple test probe system as recited in claim 9 further comprising:

providing said driven wheel having a plurality of radially extending slots and a concave cam follower guiding surface interposed between each pair of said radially extending slots;

providing said drive wheel having a drive member and a restraining cam having a cylindrical convex surface, said drive member of said drive wheel being engagable with one of said radially extending slots to incrementally rotate said driven wheel through rotation of said drive wheel; and, engaging said cylindrical convex surface of said drive wheel with said concave cam follower guiding surface of said driven wheel during a portion of time when said drive member is not engaged with said plurality of radially extending slots.

11. A method for providing a multiple test probe system as recited in claim 9 further comprising:

providing a position sensor mounted at a contact position on said support, wherein said position sensor is activated to verify when at least one of said plurality of probe assemblies is in said testing position.

12. A method for providing a multiple test probe system as recited in claim 11 further comprising:

providing said position sensor from at least one of a microswitch, an optical sensor, and a magnetic sensor.

13. A method for providing a multiple test probe system as recited in claim 9 further comprising:

coupling said electrical contacts to said probe bus in parallel.

14. A method for providing a multiple test probe system as recited in claim 9 further comprising:

providing four electrical contacts for each of said plurality of probe assemblies.

15. A method for providing a multiple test probe system as recited in claim 10 further comprising:

placing said position sensor to detect said drive member position during said portion of time said drive member is not engaged with said radially extending slots in said driven wheel.

16. A method for providing a multiple test probe system as recited in claim 10 further comprising:

shortening at least one of said plurality of radially extending slots, such that engagement of said shortened slot with said drive member prevents complete rotation of said drive wheel.

* * * * *